(12) United States Patent
Cho et al.

(10) Patent No.: US 11,784,282 B2
(45) Date of Patent: Oct. 10, 2023

(54) QUANTUM DOT DISPLAY DEVICE

(71) Applicant: SAMSUNG ELECTRONICS CO., LTD., Suwon-si (KR)

(72) Inventors: Oul Cho, Suwon-si (KR); Eun Joo Jang, Suwon-si (KR); Tae Hyung Kim, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 287 days.

(21) Appl. No.: 16/658,604

(22) Filed: Oct. 21, 2019

(65) Prior Publication Data
US 2020/0135967 A1    Apr. 30, 2020

(30) Foreign Application Priority Data

Oct. 26, 2018  (KR) .................. 10-2018-0129368
Oct. 15, 2019  (KR) .................. 10-2019-0127902

(51) Int. Cl.
*H01L 33/06* (2010.01)
*H01L 27/15* (2006.01)
*H01L 33/36* (2010.01)
*H01L 33/56* (2010.01)

(52) U.S. Cl.
CPC ............ *H01L 33/06* (2013.01); *H01L 27/156* (2013.01); *H01L 33/36* (2013.01); *H01L 33/56* (2013.01)

(58) Field of Classification Search
CPC ......... H01L 33/06; H01L 33/36; H01L 33/56; H01L 27/156
See application file for complete search history.

(56) References Cited

U.S. PATENT DOCUMENTS

| 9,651,826 | B2 | 5/2017 | Oba et al. | |
| 2010/0091224 | A1* | 4/2010 | Cho | G02B 5/201 349/105 |
| 2013/0011646 | A1 | 1/2013 | Hwang et al. | |
| 2015/0287927 | A1* | 10/2015 | Okubo | H01L 51/004 257/40 |
| 2015/0330603 | A1 | 11/2015 | Oba et al. | |

(Continued)

FOREIGN PATENT DOCUMENTS

| JP | 2016145950 A | 8/2016 |
| JP | 2017134188 A | 8/2017 |

(Continued)

OTHER PUBLICATIONS

M S Xu et al., "Nanoscale investigation of moisture-induced degradation mechanisms of tris(8-hydroxyquinoline) aluminium-based organic light-emitting diodes," Journal of Physics D: Applied Physics, Sep. 1, 2004, pp. 2618-2622, vol. 37.

*Primary Examiner* — Christine A Enad
(74) *Attorney, Agent, or Firm* — CANTOR COLBURN LLP

(57) ABSTRACT

A quantum dot display device includes a substrate, a quantum dot diode disposed on the substrate and including a first electrode, a second electrode, and a quantum dot layer between the first electrode and the second electrode, and an encapsulation film disposed on a surface of the quantum dot diode, wherein a water vapor transmission rate of the encapsulation film is about 0.001 to about 1 gram per square meter per day at 1 atmosphere of pressure.

21 Claims, 11 Drawing Sheets

(56) References Cited

U.S. PATENT DOCUMENTS

| | | | |
|---|---|---|---|
| 2017/0017022 A1* | 1/2017 | Yonemoto | G02B 6/005 |
| 2017/0279086 A1* | 9/2017 | Fukuda | H01L 51/0012 |
| 2018/0170009 A1 | 6/2018 | Kuniyasu | |
| 2018/0248149 A1 | 8/2018 | Johnson et al. | |
| 2019/0058093 A1* | 2/2019 | O'Brien | C08L 33/04 |
| 2019/0115550 A1* | 4/2019 | Kim | H01L 51/502 |
| 2019/0333425 A1* | 10/2019 | Yasuda | H01L 27/1266 |
| 2020/0274097 A1* | 8/2020 | Ichikawa | H01L 27/3276 |

FOREIGN PATENT DOCUMENTS

| | | | |
|---|---|---|---|
| JP | 2018124412 A | * | 8/2018 |
| KR | 20110063384 A | | 6/2011 |
| KR | 20160117063 A | | 10/2016 |
| KR | 20170003320 A | | 1/2017 |
| KR | 20170010419 A | | 1/2017 |
| KR | 20180030583 A | | 3/2018 |
| KR | 20180031793 A | | 3/2018 |

* cited by examiner

QUANTUM DOT DISPLAY DEVICE

CROSS-REFERENCE TO RELATED APPLICATION

This application claims priority to and the benefit of Korean Patent Application No. 10-2018-0129368 and 10-2019-0127902 filed in the Korean Intellectual Property Office on Oct. 26, 2018, and Oct. 15, 2019, respectively, and all the benefits accruing therefrom under 35 U.S.C. § 119, the contents of which in their entirety are herein incorporated by reference.

BACKGROUND

1. Field

A quantum dot display device is disclosed.

2. Description of the Related Art

Physical characteristics (e.g., energy bandgaps, melting points, etc.) of nanoparticles that are intrinsic characteristics may be controlled by changing the particle sizes of the nanoparticles, unlike bulk materials. For example, when semiconductor nanocrystals also known as quantum dots are supplied with photoenergy or electrical energy, the quantum dots may emit light of a predetermined wavelength corresponding to sizes of the quantum dots. Accordingly, the quantum dots may be used as a light emitting element emitting light of a predetermined wavelength.

SUMMARY

A quantum dot device may use quantum dots as a light emitting element. However, the quantum dots are different from conventional light emitting elements, and thus a method of improving performance of the quantum dot device is desired.

An embodiment may provide a quantum dot display device capable of simplifying processes, for example, for production thereof, and exhibiting improved durability, and being flexible.

According to an embodiment, a quantum dot display device includes a substrate, a quantum dot diode on the substrate and including a first electrode, a second electrode, and a quantum dot layer between the first electrode and the second electrode, and an encapsulation film on a surface of the quantum dot diode, wherein a water vapor transmission rate of the encapsulation film is about 0.001 to about 1 gram per square meter per day at 1 atmosphere (atm) of pressure ($g/m^2 \cdot day \cdot atm$).

The encapsulation film may be disposed on a first surface of the quantum dot diode and a second surface of the quantum dot diode, the second surface of the quantum dot diode being opposite the first surface of the quantum dot diode.

The encapsulation film may consist of two layers.

The encapsulation film may include an organic film.

The organic film may include a thiol resin, an epoxy resin, or a combination thereof.

The encapsulation film may include an inorganic film.

The inorganic film may include an oxide, a nitride, an oxynitride, or a combination thereof.

The encapsulation film may include an organic film and an inorganic film.

The quantum dot display device may further include a primer layer on the encapsulation film and being thinner than the encapsulation film.

The encapsulation film may be disposed between the substrate and the quantum dot diode.

A first surface of the substrate may face the quantum dot diode, a second surface of the substrate may be opposite the first surface of the substrate, the second surface of the substrate may not face the quantum dot diode, and the encapsulation film may be disposed on the second surface of the substrate.

The encapsulation film may be disposed directly on the quantum dot diode.

The quantum dot display device may further include a second substrate facing the substrate, the second substrate being disposed on a surface of the encapsulation film.

The quantum dot display device may further include a sealing material between the quantum dot diode and the encapsulation film.

A water vapor transmission rate of the encapsulation film may be about 0.01 to about 1 $g/m^2 \cdot day \cdot atm$.

An oxygen transmission rate of the encapsulation film may be about 0.001 to about 1 cubic centimeter per square meter per day at 1 atm of pressure ($cc/m^2 \cdot day \cdot atm$).

The quantum dot layer may include a core-shell quantum dot and the quantum dot may include a core including zinc (Zn) and tellurium (Te), selenium (Se), or a combination thereof and a shell disposed on at least one part of the core, the shell having a composition different from a composition of the core.

The shell may include ZnSeS, ZnS, or a combination thereof.

The quantum dot layer may include a core-shell quantum dot and the quantum dot may include a core including indium (In) and zinc (Zn), phosphorus (P), or a combination thereof and a shell disposed on at least one part of the core, the shell having a composition different from a composition of the core.

The shell may include ZnSeS, ZnS, or a combination thereof.

The quantum dot display device may be a bendable, foldable, curved, or rollable.

The quantum dot display device may simplify processes, for example, for production thereof, and exhibit improved durability, and may be flexible.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
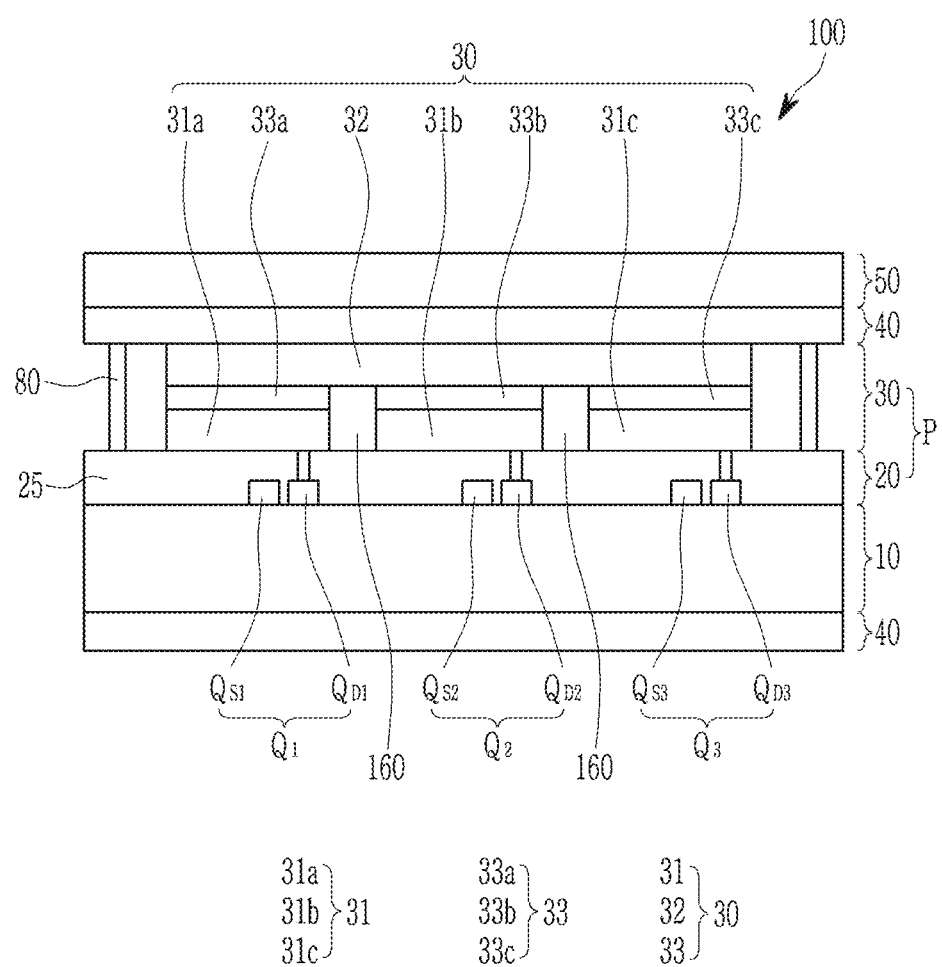
FIG. 1 is a schematic cross-sectional view of a quantum dot display device according to an embodiment.

Hereinafter, example embodiments of the present disclosure will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, "a first element," "component," "region," "layer" or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a work function, a highest occupied molecular orbital (HOMO) energy level, and a lowest unoccupied molecular orbital (LUMO) energy level are expressed as an absolute value from a vacuum level. In addition, when the work function, HOMO energy level, and LUMO energy level are referred to be "deep," "high" or "large," the work function, HOMO energy level, and LUMO energy level have a large absolute value from "0 electronvolts (eV)" of the vacuum level, while when the work function, HOMO energy level and LUMO energy level are referred to be "shallow," "low," or "small," the work function, HOMO energy level, and LUMO energy level have a small absolute value from "0 eV" of the vacuum level.

Hereinafter, "encapsulation thin film" and "encapsulation film" may be used interchangeably.

Hereinafter, a quantum dot display device according to an embodiment is described with reference to the drawings.

FIG. 1 is a schematic cross-sectional view of a quantum dot display device according to an embodiment.

Referring to FIG. 1, a quantum dot display device 100 according to an embodiment includes a base substrate 10, an active array layer 20, a quantum dot diode 30, an encapsulation thin film 40, and an opposed substrate 50.

The quantum dot display device 100 includes a plurality of unit pixel groups to display a full color, and the plurality of unit pixel groups may be disposed alternately along a row, a column, or a combination thereof. Each unit pixel group includes a plurality of pixels, and may have, for example various arrangements such as a 2×2 matrix, a 3×3 matrix, and the like. Each unit pixel group may include, for example a red pixel, a green pixel, and a blue pixel, and may further include a white pixel. The structures and arrangement of the unit pixel group may be variously modified.

The base substrate 10 may be a glass substrate, a polymer substrate, or a semiconductor substrate. The polymer substrate may be, for example, a polycarbonate, a polymethylmethacrylate, a polyethylene terephthalate, a polyethylene naphthalate, a polyamide, a polyethersulfone, a copolymer thereof, a derivative thereof, or a combination thereof, but is not limited thereto. When a polymer substrate is used, a flexible quantum dot display device may be effectively implemented, e.g., provided.

The active array layer 20 may include thin film transistor arrays $Q_1$, $Q_2$, and $Q_3$ including a plurality of thin film transistors and the thin film transistor arrays $Q_1$, $Q_2$, and $Q_3$ include switching thin film transistors $Q_{S1}$, $Q_{S2}$, and $Q_{S3}$ and driving thin film transistors $Q_{D1}$, $Q_{D2}$, and $Q_{D3}$ in each pixel. The switching thin film transistors $Q_{S1}$, $Q_{S2}$, and $Q_{S3}$ and the driving thin film transistors $Q_{D1}$, $Q_{D2}$, and $Q_{D3}$ are electrically connected to each other.

The switching thin film transistors $Q_{S1}$, $Q_{S2}$, and $Q_{S3}$ have a control terminal, an input terminal, and an output terminal, wherein the control terminal is connected with a gate line, the input terminal is connected with a data line, and the output terminal is connected to the driving thin film transistors $Q_{D1}$, $Q_{D2}$, and $Q_{D3}$. The switching thin film transistors $Q_{S1}$, $Q_{S2}$, and $Q_{S3}$ may provide a response to a scan signal applied to the gate line and deliver a data signal to the driving thin film transistors $Q_{D1}$, $Q_{D2}$, and $Q_{D3}$.

The driving thin film transistors $Q_{D1}$, $Q_{D2}$, and $Q_{D3}$ also have a control terminal, an input terminal, and an output terminal, wherein the control terminal is connected to the switching thin film transistors $Q_{S1}$, $Q_{S2}$, and $Q_{S3}$, the input terminal is connected to a driving voltage line, and the output terminal is connected to the quantum dot diode 30. The driving thin film transistors $Q_{D1}$, $Q_{D2}$, and $Q_{D3}$ may shed, e.g., provide, an output current having a changing size depending on a voltage applied between the control terminal and the output terminal.

Switching thin film transistor $Q_{S1}$, $Q_{S2}$, $Q_{S3}$, or a combination thereof and driving thin film transistor $Q_{D1}$, $Q_{D2}$, $Q_{D3}$, or a combination thereof may be included in each pixel. The switching thin film transistor $Q_{S1}$, $Q_{S2}$, $Q_{S3}$, or a combination thereof or the driving thin film transistor $Q_{D1}$, $Q_{D2}$, $Q_{D3}$, or a combination thereof may be omitted as desired.

An insulation layer 25 is disposed on the active array layer 20. The insulation layer 25 has a plurality of contact holes partly exposing the switching thin film transistors $Q_{S1}$, $Q_{S2}$, and $Q_{S3}$ and the driving thin film transistors $Q_{D1}$, $Q_{D2}$, and $Q_{D3}$.

The quantum dot diode 30 is disposed on the insulation layer 25. The quantum dot diode 30 may include a first quantum dot diode displaying a first color, a second quantum dot diode displaying a second color, and a third quantum dot diode displaying a third color, wherein the first color, the second color, and the third color may be one of three primary colors and different from each other, but are not limited thereto.

The quantum dot diode 30 includes a lower electrode 31, an upper electrode 32, and a quantum dot layer 33 disposed between the lower electrode 31 and the upper electrode 32. The lower electrode 31 includes a first lower electrode 31a, a second lower electrode 31b, and a third lower electrode 31c which are disposed in the first to third quantum dot diodes respectively, and the quantum dot layer 33 includes a first quantum dot layer 33a, a second quantum dot layer 33b, and a third quantum dot layer 33c which are disposed in the first to third quantum dot diodes respectively. The upper electrode 32 may be a common electrode known for use in the first to third quantum dot diodes. Among the first quantum dot diode, the second quantum dot diode, and the third quantum dot diode, a barrier rib 160 made of an insulating material such as polyimide may be formed, but is not limited thereto.

The lower electrode 31 is connected to the output terminal of the driving thin film transistors $Q_{D1}$, $Q_{D2}$, and $Q_{D3}$ and the upper electrode 140 is connected to a common voltage.

One of the lower electrode 31 and the upper electrode 32 may be an anode, and the other may be a cathode. For example, the lower electrode 31 may be an anode and the upper electrode 32 may be a cathode.

The anode may be made of a conductor having relatively high work function, and may be for example made of a metal, a conductive metal oxide, or a combination thereof. The anode may be for example made of a metal or an alloy thereof such as nickel, platinum, vanadium, chromium, copper, zinc, gold, or a combination thereof; a conductive metal oxide such as zinc oxide, indium oxide, tin oxide, indium tin oxide (ITO), indium zinc oxide (IZO), or fluorine doped tin oxide; or a combination of metal and oxide such as ZnO and Al or $SnO_2$ and Sb, but is not limited thereto.

The cathode may be for example made of a conductor having a work function that is less than a work function of the anode and may be for example made of a metal, a conductive metal oxide, a conductive polymer, or a combination thereof. The cathode may be for example a metal or an alloy thereof such as for example aluminum, magnesium, calcium, sodium, potassium, titanium, indium, yttrium, lithium, gadolinium silver, tin, lead, cesium, barium, or a combination thereof; or a multi-layer structure material such as LiF/Al, $LiO_2$/Al, Liq/Al, LiF/Ca, and $BaF_2$/Ca, but is not limited thereto.

The lower electrode 31, the upper electrode 32, or a combination thereof may be a light-transmitting electrode and the light-transmitting electrode may be for example made of a transparent conductive oxide such as zinc oxide, indium oxide, tin oxide, indium tin oxide (ITO), indium zinc oxide (IZO), or fluorine doped tin oxide, or a metal thin layer of a single layer or a multilayer. When the lower electrode 31 or the upper electrode 32 is a non-light-transmitting electrode, the lower electrode 31 or the upper electrode 32 may be made of for example an opaque conductor such as aluminum (Al), silver (Ag), or gold (Au).

The quantum dot layer 33 includes a quantum dot. The quantum dot may be a semiconductor nanocrystal, and may have various shapes, for example a spherical semiconductor nanocrystal, a quantum rod, or a quantum plate. Herein, the quantum rod may indicate a quantum dot having an aspect ratio of greater than about 1:1, for example an aspect ratio of greater than or equal to about 2:1, greater than or equal to about 3:1, or greater than or equal to about 5:1. For example, the quantum rod may have an aspect ratio of less than or equal to about 50:1, of less than or equal to about 30:1, or of less than or equal to about 20:1.

The quantum dot may have for example a particle diameter (an average largest particle diameter for a non-spherical shape) of for example about 1 nanometers (nm) to about 100 nm, about 1 nm to about 80 nm, about 1 nm to about 50 nm, or about 1 nm to about 20 nm.

An energy bandgap of quantum dot may be controlled according to a size and a composition of the quantum dot, and thus photoluminescence wavelength may be controlled. For example, as the size of quantum dot increases, the quantum dot may have a relatively narrow energy bandgap and thus may emit light in a relatively long wavelength region while as the size of the quantum dot decreases, the quantum dot may have a relatively wide energy bandgap and thus may emit light in a relatively short wavelength region.

For example, the quantum dot may emit for example light in a predetermined wavelength region of a visible light region according to the size of the quantum dot, the composition of the quantum dot, or a combination. For example, the quantum dot may emit blue light, red light, or green light, and the blue light may have for example a peak emission wavelength in a wavelength region of about 430 nm to about 470 nm, the red light may have for example a peak emission wavelength in a wavelength region of about 600 nm to about 650 nm, and the green light may have for example a peak emission wavelength in a wavelength region of about 520 nm to about 550 nm.

The first quantum dot layer 33a, the second quantum dot layer 33b, and the third quantum dot layer 33c may include a quantum dot emitting a first color, a second color, and a third color, respectively, wherein the first color, the second color, and the third color may be blue, green, and red. For example, the first quantum dot layer 33a may include a blue light emitting quantum dot emitting blue light, the second quantum dot layer 33b may include a green light emitting quantum dot emitting green light, and the third quantum dot layer 33c may include a red light emitting quantum dot emitting red light.

For example, an average size of the blue light emitting quantum dot may be for example less than or equal to about 4.5 nm, less than or equal to about 4.3 nm, less than or equal to about 4.2 nm, less than or equal to about 4.1 nm, or less than or equal to 4.0 nm. Within the ranges, the average size of the blue light emitting quantum dot may be for example about 2.0 nm to about 4.5 nm, about 2.0 nm to about 4.3 nm, about 2.0 nm to about 4.2 nm, about 2.0 about nm to about 4.1 nm, or about 2.0 nm to about 4.0 nm.

The quantum dot may have for example a quantum yield of greater than or equal to about 10%, greater than or equal to about 30%, greater than or equal to about 50%, greater than or equal to about 60%, greater than or equal to about 70%, or greater than or equal to about 90%.

The quantum dot may have a relatively narrow full width at half maximum (FWHM). Herein, the FWHM is a width of a wavelength corresponding to a half of a peak absorption point and as the FWHM is narrower, light in a narrower wavelength region may be emitted and high color purity may be obtained. The quantum dot may have for example a FWHM of less than or equal to about 50 nm, less than or equal to about 49 nm, less than or equal to about 48 nm, less than or equal to about 47 nm, less than or equal to about 46 nm, less than or equal to about 45 nm, less than or equal to about 44 nm, less than or equal to about 43 nm, less than or equal to about 42 nm, less than or equal to about 41 nm, less than or equal to about 40 nm, less than or equal to about 39 nm, less than or equal to about 38 nm, less than or equal to about 37 nm, less than or equal to about 36 nm, less than or equal to about 35 nm, less than or equal to about 34 nm, less than or equal to about 33 nm, less than or equal to about 32 nm, less than or equal to about 31 nm, less than or equal to about 30 nm, less than or equal to about 29 nm, or less than or equal to about 28 nm.

For example, the quantum dot may be for example a Group II-VI semiconductor compound, a Group III-V semiconductor compound, a Group IV-VI semiconductor compound, a Group IV semiconductor element or compound, a Group semiconductor compound, a Group I-II-IV-VI semiconductor compound, a Group II-III-V semiconductor compound, or a combination thereof. The Group II-VI semiconductor compound may be for example a binary element of CdSe, CdTe, ZnS, ZnSe, ZnTe, ZnO, HgS, HgSe, HgTe, MgSe, MgS, or a combination thereof; a ternary element of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; and a quaternary element of ZnSeSTe, HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof; or a combination thereof, but is not limited thereto. The Group III-V semiconductor compound may be for example a binary element of GaN, GaP, GaAs, GaSb, AlN, AlP, AlAs, AlSb, InN, InP, InAs, InSb, or a combination thereof; a ternary element of GaNP, GaNAs, GaNSb, GaPAs, GaPSb, AlNP, AlNAs, AlNSb, AlPAs, AlPSb, InNP, InNAs, InNSb, InPAs, InPSb, or a combination thereof; and a quaternary element of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof; or a combination thereof, but is not limited thereto. The Group IV-VI semiconductor compound may be for example a binary element of SnS, SnSe, SnTe, PbS, PbSe, PbTe, or a combination thereof; a ternary element of SnSeS, SnSeTe, SnSTe, PbSeS, PbSeTe, PbSTe, SnPbS, SnPbSe, SnPbTe, or a combination thereof; and a quaternary element of SnPbSSe, SnPbSeTe, SnPbSTe, or a combination thereof; a combination thereof, but is not limited thereto. The Group IV semiconductor compound may be for example a singular element semiconductor of Si, Ge, or a combination thereof; and a binary element of SiC, SiGe, or a combination thereof; a combination thereof, but is not limited thereto. The Group I-III-VI semiconductor compound may be for example $CuInSe_2$, $CuInS_2$, CuInGaSe, CuInGaS, and a combination thereof, but is not limited thereto. The Group I-III-VI semiconductor compound may be for example $CuInSe_2$, $CuInS_2$, CuInGaSe, CuInGaS, a combination thereof, but is not limited thereto. The Group II-III-V semiconductor compound may be for example InZnP, but is not limited thereto.

The quantum dot may include the binary semiconductor compound, the ternary semiconductor compound, or the quaternary semiconductor compound in a substantially uniform concentration or partially different concentration distributions, e.g., concentration gradients.

For example, the quantum dot may include a non-cadmium-based quantum dot. Cadmium (Cd) may cause severe environment/health problems and is a restricted element by Restriction of Hazardous Substances Directive (RoHS) in a plurality of countries, and a non-cadmium-based quantum dot may be used.

For example, the quantum dot may be a semiconductor compound including zinc (Zn) and tellurium (Te), selenium (Se), or a combination thereof. For example, the quantum dot may be a Zn—Te semiconductor compound, a Zn—Se semiconductor compound, a Zn—Te—Se semiconductor compound, or a combination thereof, and may be a blue light emitting quantum dot. For example, in the Zn—Te—Se semiconductor compound, an amount of tellurium (Te) may be smaller than that of selenium (Se). The semiconductor compound may emit blue light having a peak emission wavelength in a wavelength region of less than or equal to about 470 nm, for example in a wavelength region of about 430 nm to about 470 nm.

For example, the quantum dot may be for example a semiconductor compound including indium (In) and zinc (Zn), phosphorus (P), or a combination thereof. For example, the quantum dot may be an In—Zn semiconductor compound, an In—P semiconductor compound, an In—Zn—P semiconductor compound, or a combination thereof, and may be a blue light emitting quantum dot. For example, in the In—Zn semiconductor compound or the In—Zn—P semiconductor compound, a molar ratio of zinc (Zn) relative to indium (In) may be greater than or equal to about 25:1. The semiconductor compound may emit blue light having a peak emission wavelength in a wavelength region of less than or equal to about 470 nm, for example in a wavelength region of about 430 nm to about 470 nm.

The quantum dot may have a core-shell structure wherein one quantum dot surrounds another quantum dot. For example, the core and the shell of the quantum dot may have an interface, and an element the core, an element of the shell, or a combination thereof in the interface may have a concentration gradient wherein the concentration of the element(s) of the shell decreases toward the core, e.g., in a direction from the shell toward the core. For example, a material composition of the shell of the quantum dot may have a higher, e.g., larger, energy bandgap than a material composition of the core of the quantum dot, and thereby the quantum dot may exhibit a quantum confinement effect.

The quantum dot may have one quantum dot core and a multi-layered quantum dot shell surrounding the core. Herein, the multi-layered shell has at least two shells wherein each shell may be, e.g., include, a single composition, an alloy, a concentration gradient, or a combination thereof.

For example, a shell of a multi-layered shell that is far, e.g., relatively farther, from the core may have a higher, e.g., larger, energy bandgap than a shell that is near, e.g., relatively closer, to the core, and the quantum dot may exhibit a quantum confinement effect.

For example, the quantum dot having a core-shell structure may for example include a core including a first semiconductor compound including zinc (Zn) and tellurium (Te), selenium (Se), or a combination thereof, and a shell disposed on at least one part of the core and including a second semiconductor compound having a different composition from that of the core.

A Zn—Te—Se-based first semiconductor compound may be for example a Zn—Se-based semiconductor compound including a small amount of tellurium (Te) and, for example, a semiconductor compound represented by $ZnTe_xSe_{1-x}$ (wherein, x is greater than about 0 and less than or equal to about 0.05).

For example, in the Zn—Te—Se-based first semiconductor compound, the mole amount of zinc (Zn) may be larger than that of selenium (Se), and the mole amount of selenium (Se) may be larger than that of tellurium (Te). For example, in the first semiconductor compound, a molar ratio of tellurium (Te) relative to selenium (Se) may be less than or equal to about 0.05:1, less than or equal to about 0.049:1, less than or equal to about 0.048:1, less than or equal to about 0.047:1, less than or equal to about 0.045:1, less than or equal to about 0.044:1, less than or equal to about 0.043:1, less than or equal to about 0.042:1, less than or equal to about 0.041:1, less than or equal to about 0.04:1, less than or equal to about 0.039:1, less than or equal to about 0.035:1, less than or equal to about 0.03:1, less than or equal to about 0.029:1, less than or equal to about 0.025:1, less than or equal to about 0.024:1, less than or equal to about 0.023:1, less than or equal to about 0.022:1, less than or equal to about 0.021:1, less than or equal to about 0.02:1, less than or equal to about 0.019:1, less than or equal to about 0.018:1, less than or equal to about 0.017:1, less than or equal to about 0.016:1, less than or equal to about 0.015:1, less than or equal to about 0.014:1, less than or equal to about 0.013:1, less than or equal to about 0.012:1, less than or equal to about 0.011:1, or less than or equal to about 0.01:1. For example, in the first semiconductor compound, a molar ratio of tellurium (Te) relative to zinc (Zn) may be less than or equal to about 0.02:1, less than or equal to about 0.019:1, less than or equal to about 0.018:1, less than or equal to about 0.017:1, less than or equal to about 0.016:1, less than or equal to about 0.015:1, less than or equal to about 0.014:1, less than or equal to about 0.013:1, less than or equal to about 0.012:1, or less than or equal to about 0.011:1.

The second semiconductor compound may include for example a Group II-VI semiconductor compound, a Group III-V semiconductor compound, a Group IV-VI semiconductor compound, a Group IV semiconductor element or compound, a Group I-III-VI semiconductor compound, a Group I-II-IV-VI semiconductor compound, a Group II-III-V semiconductor compound, or a combination thereof. Examples of the Group II-VI semiconductor compound, the Group III-V semiconductor compound, the Group IV-VI semiconductor compound, the Group IV semiconductor element or compound, the Group I-III-VI semiconductor compound, the Group I-II-IV-VI semiconductor compound, and the Group II-III-V semiconductor compound are the same as described above.

For example, the second semiconductor compound may include zinc (Zn), selenium (Se), sulfur (S), or a combination thereof. For example, the shell may include at least one internal shell disposed near, e.g., relatively closer, to the core and an outermost shell disposed at the outermost shell of the quantum dot and the internal shell may include ZnSeS and the outermost shell may include ZnS. For example, the shell may have a concentration gradient of one component and for example an amount of sulfur (S) may increase as being apart from the core, e.g., in a direction from the core toward the shell.

For example, the quantum dot having a core-shell structure may include for example a core including a third semiconductor compound including indium (In) and zinc (Zn), phosphorus (P), or a combination thereof and a shell disposed on at least one part of the core and including a fourth semiconductor compound having a different composition from the core.

In the In—Zn—P-based third semiconductor compound, a molar ratio of zinc (Zn) relative to indium (In) may be greater than or equal to about 25:1. For example, in the In—Zn—P-based first semiconductor compound, the molar ratio of zinc (Zn) relative to indium (In) may be greater than or equal to about 28:1, greater than or equal to about 29:1, or greater than or equal to about 30:1. For example, in the In—Zn—P-based first semiconductor compound, the molar ratio of zinc (Zn) relative to indium (In) may be less than or equal to about 55:1, for example less than or equal to about 50:1, less than or equal to about 45:1, less than or equal to about 40:1, less than or equal to about 35:1, less than or equal to about 34:1, less than or equal to about 33:1, or less than or equal to about 32:1.

The fourth semiconductor compound may include for example a Group II-VI semiconductor compound, a Group III-V semiconductor compound, a Group IV-VI semiconductor compound, a Group IV semiconductor element or compound, a Group I-III-VI semiconductor compound, a Group I-II-IV-VI semiconductor compound, a Group II-III-V semiconductor compound, or a combination thereof. Examples of the Group II-VI semiconductor compound, the Group III-V semiconductor compound, the Group IV-VI semiconductor compound, the Group IV semiconductor element or compound, the Group I-III-VI semiconductor compound, the Group I-II-IV-VI semiconductor compound, and the Group II-III-V semiconductor compound are the same as described above.

For example, the fourth semiconductor compound may include zinc (Zn) and sulfur (S), and optionally selenium (Se). For example, the shell may include at least one internal shell disposed near to the core and an outermost shell disposed at the outermost shell of the quantum dot and the internal shell, the outermost shell, or a combination thereof may include the fourth semiconductor compound of ZnS or ZnSeS.

The quantum dot layer 33 may have for example a thickness of about 5 nm to about 200 nm, for example about 10 nm to about 150 nm, about 10 nm to about 100 nm, or about 10 nm to about 50 nm.

The quantum dot diode 30 may further include a charge auxiliary layer (not shown) between the lower electrode 31 and the quantum dot layer 33, between the upper electrode 32 and the quantum dot layer 33, or a combination thereof. The charge auxiliary layer may have a single layer or two or more layers, and may help holes or electrons be injected, transported, or a combination thereof from the lower electrode 31 into the quantum dot layer 33, from the upper electrode 32 into the quantum dot layer 33, or a combination thereof. The charge auxiliary layer may include, for example a hole injection layer, a hole transport layer, an electron blocking layer, an electron injection layer, a charge transport layer, a hole blocking layer, or a combination thereof.

For example, the charge auxiliary layer may include a hole transport layer and the hole transport layer may include for example poly(9,9-dioctyl-fluorene-co-N-(4-butylphenyl)-diphenylamine (TFB), polyarylamine, poly(N-vinylcarbazole, poly(3,4-ethylenedioxythiophene) (PEDOT), poly(3,4-ethylenedioxythiophene) polystyrene sulfonate (PEDOT:PSS), polyaniline, polypyrrole, N,N,N',N'-tetrakis (4-methoxyphenyl)-benzidine (TPD), (4-bis[N-(1-naphthyl)-N-phenyl-amino]biphenyl (α-NPD), m-MTDATA (4,4',4"-tris[phenyl(m-tolyl)amino]triphenylamine), 4,4',4"-tris(N-carbazolyl)-triphenylamine (TCTA), 1-bis[(di-4-tolylamino)phenylcyclohexane (TAPC), p-type metal oxide (e.g., NiO, $WO_3$, $MoO_3$, etc.), a carbon-based material such as graphene oxide, and a combination thereof, but is not limited thereto, but is not limited thereto.

In FIG. 1, the quantum dot layer 33 is separated for each pixel, but the present disclosure is not limited thereto. The quantum dot layer 33 may be formed as a common layer in the quantum dot diode 30, and may include for example a first quantum dot layer 33a emitting light of a first color, a second quantum dot layer 33b emitting light of a second color, and a third quantum dot layer 33c emitting light of a third color which are laminated.

The opposed substrate 50 faces the base substrate 10 and may be for example a glass substrate, a polymer substrate, or a semiconductor substrate. The polymer substrate may be for example a polycarbonate, a polymethyl methacrylate, a polyethylene terephthalate, a polyethylene naphthalate, a polyamide, a polyethersulfone, a copolymer thereof, a derivative thereof, or a combination thereof, but is not limited thereto. The polymer substrate may implement, e.g., help provide, a flexible quantum dot display device effectively. The base substrate 10 and the opposed substrate 50 may be bonded by a sealing material 80.

The encapsulation thin film 40 may be disposed on at least one surface of the quantum dot diode 30, for example both surfaces of the quantum dot diode 30. The encapsulation thin film 40 may be disposed on an upper surface of the quantum dot diode 30, a lower surface of the quantum dot diode 30, or a combination thereof.

For example, even though FIG. 1 shows an embodiment in which the encapsulation thin film 40 is disposed between the quantum dot diode 30 and the opposed substrate 50, the encapsulation thin film 40 is not limited thereto and may be located on the opposed substrate 50.

For example, even though FIG. 1 shows an embodiment in which the encapsulation thin film 40 is disposed under the base substrate 10, the encapsulation thin film 40 is not limited thereto and may be disposed between the quantum dot diode 30 and the base substrate 10.

For example, even though FIG. 1 shows an embodiment in which the encapsulation thin films 40 are disposed on the lower surface and the upper surface of the quantum dot diode 30, respectively, the present disclosure is not limited thereto and the encapsulation thin films 40 disposed on the lower surface of the quantum dot diode 30 or the encapsulation thin films 40 disposed on the upper surface of the quantum dot diode 30 may be omitted.

The encapsulation thin film 40 may include, e.g., consist of, two layers.

A water vapor transmission rate (WVTR) of the encapsulation thin film 40 may be about 0.001 to about 1 $g/m^2 \cdot day \cdot atm$, for example about 0.01 to about 1 $g/m^2 \cdot day \cdot atm$. The water vapor transmission rate may be a numerical value indicative of the content of water permeable through an area of 1 $m^2$ per day at 1 atm atmospheric pressure. For example, the water vapor transmission rate may be measured at a relative humidity of 100% and at a temperature of 23° C., 25° C., 30° C., 33° C., 37° C., or 38° C., for example, in accordance with ASTM F-1249 standard.

The quantum dot display device 100 may have a high durability against water vapor by including a quantum dot layer including a quantum dot, for example a quantum dot of a core-shell structure, as a light emitting element, unlike an organic light emitting diode display including an organic material as a light emitting element. Accordingly, the water vapor transmission rate of the encapsulation thin film 40 of, e.g., allowed in, the quantum dot display device 100 may be greater than the water vapor transmission rate of the encapsulation thin film of, e.g., allowed in, the organic light emitting diode display. Herein, the allowed water vapor transmission rate may be a water vapor transmission rate that has a minimal or no effect on efficiency, life-span, or a combination thereof of a display device and may be, for example a water vapor transmission rate when a decrease of efficiency, effective light-emitting area, life-span, or a combination thereof is less than or equal to about 10%, less than or equal to about 8%, less than or equal to about 7%, less than or equal to about 5%, less than or equal to about 3%, less than or equal to about 2%, less than or equal to about 1%, less than or equal to about 0.5%, or less than or equal to about 0.1%. Accordingly, even though a water vapor transmission rate of the encapsulation thin film 40 in the quantum dot display device 100 may be about 100 to 100,000 times as high as the water vapor transmission rate desired in the organic light emitting diode display, degradation of a display quality by water vapor of the quantum dot display device 100 may be prevented and a water vapor transmission rate of the encapsulation thin film may be, for example about 0.001 to 1 $g/m^2 \cdot day \cdot atm$ or about 0.01 to 1 $g/m^2 \cdot day \cdot atm$.

An oxygen transmission rate (OTR) of the encapsulation thin film 40 may be about 0.001 to about 1 $cc/m^2 \cdot day \cdot atm$, for example about 0.01 to about 1 $cc/m^2 \cdot day \cdot atm$. The oxygen transmission rate may be a numerical value indicative of the content of oxygen permeable through an area of 1 m² per day at 1 atm atmospheric pressure. For example, the oxygen transmission rate may be measured at a relative humidity of 0% and at a temperature of 23° C., 25° C., 30° C., 33° C., 35° C., 37° C., or 38° C. for example, in accordance with ASTM D-3985 standard.

As described above, the quantum dot display device 100 may have a high durability against oxygen by including a quantum dot layer including a quantum dot, for example a quantum dot of a core-shell structure, as a light emitting element, unlike an organic light emitting diode display including an organic material as a light emitting element. Accordingly, the oxygen transmission rate of the encapsulation thin film 40 of, e.g., allowed in, the quantum dot display device 100 may be greater than the oxygen transmission rate of the encapsulation thin film of, e.g., allowed in, the organic light emitting diode display. Herein, the allowed oxygen transmission rate may be an oxygen transmission rate that has a minimal or no effect on efficiency, life-span, or a combination thereof of a display device and may be, for example an oxygen transmission rate when a decrease of efficiency, effective light-emitting area, life-span, or a combination thereof is less than or equal to about 10%, less than or equal to about 8%, less than or equal to about 7%, less than or equal to about 5%, less than or equal to about 3%, less than or equal to about 2%, less than or equal to about 1%, less than or equal to about 0.5%, or less than or equal to about 0.1%. Accordingly, even though an oxygen transmission rate of the encapsulation thin film 40 in the quantum dot display device 100 may be about 100 to 100,000 times as high as the oxygen transmission rate desired in the organic light emitting diode display degradation of a display quality by water vapor of the quantum dot display device 100 may be prevented and an oxygen transmission rate of the encapsulation thin film may be, for example about 0.001 to about 1 cc/m²·day·atm or about 0.01 to about 1 cc/m²·day·atm.

In this way, the encapsulation thin film 40 may have a relatively high water vapor transmission rate and oxygen transmission rate and thus may have a simple structure including, e.g., composed of, one layer or two layers. Accordingly, the encapsulation thin film 40 including, e.g., consisting of, one layer or two layers may provide a flexible encapsulation thin film 40 as well as save manufacturing time, cost, or a combination thereof by simplifying a manufacturing process of the encapsulation thin film 40 in the quantum dot display device 100, compared with a multi-layered encapsulation thin film having at least 3 layers, for example, 5 layers to 10 layers in the organic light emitting diode display, and thus may be effectively applied to a bendable quantum dot display device, a foldable quantum dot display device, a curved quantum dot display device, or a rollable quantum dot display device without deteriorating performance because of permeation of water vapor and oxygen.

Figure 2:
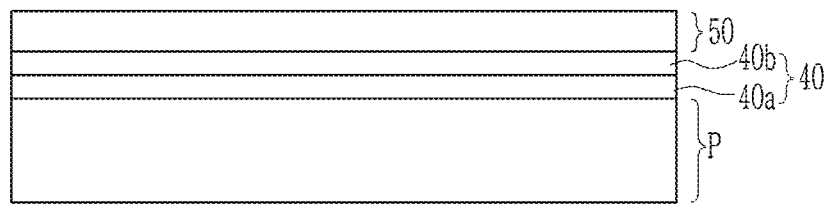
FIGS. 2 and 3 are schematic views of encapsulation thin films according to embodiments.
Figure 3:
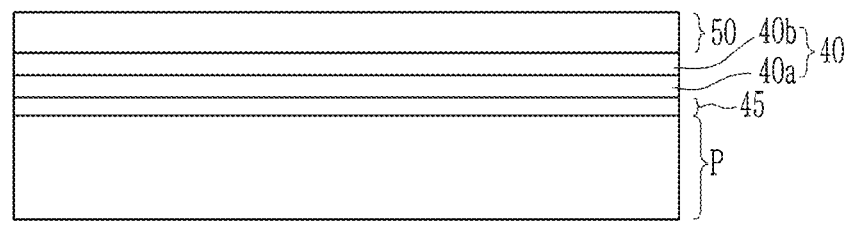

FIGS. 2 and 3 are schematic views showing encapsulation thin films according to embodiments.

Referring to FIGS. 1, 2, and 3, the encapsulation thin film 40 may be disposed on a laminate (P) of the active array layer 20 and the quantum dot diode 30 and may be disposed between the laminate (P) and the opposed substrate 50.

Referring to FIG. 2, the encapsulation thin film 40 may include, e.g., consist of, two layers and may include, e.g., consist of, a first encapsulation thin film 40a adjacent to the laminate (P) and a second encapsulation thin film 40b adjacent to opposed substrate 50.

For example, the first encapsulation thin film 40a and the second encapsulation thin film 40b may be an inorganic thin film including an inorganic material or an organic thin film including an organic material. For example, at the first encapsulation thin film 40a, the second encapsulation thin film 40b, or a combination thereof may be an inorganic thin film. For example, the first encapsulation thin film 40a, the second encapsulation thin film 40b, or a combination thereof may be an organic thin film. For example, the first encapsulation thin film 40a or the second encapsulation thin film 40b may be an inorganic thin film and the other of the first encapsulation thin film 40a and the second encapsulation thin film 40b may be an organic thin film. For example, the first encapsulation thin film 40a may be an inorganic thin film and the second encapsulation thin film 40b may be an organic thin film. For example, the first encapsulation thin film 40a may be an organic thin film and the second encapsulation thin film 40b may be an inorganic thin film.

The organic material may include a polymer and the polymer may be for example a curable resin, for example a photocurable resin, for example a thiol-based resin, an epoxy resin, or a combination thereof, but is not limited thereto. The inorganic material may be for example an oxide, a nitride, an oxynitride, or a combination thereof, for example a metal oxide, a metal nitride, a metal oxynitride, a semi-metal oxide, a semi-metal nitride, a semi-metal oxynitride, or a combination thereof, for example a metal oxide, a metal nitride, a metal oxynitride, a semi-metal oxide, a semi-metal nitride, a semi-metal oxynitride, or a combination thereof which include Si, Ge, Ga, Al, In, Sn, Zn, Zr, Ti, Cu, Ce, La, Ba, Mg, Sr Ta, or a combination thereof, but is not limited thereto.

A thickness of the first encapsulation thin film 40a may be, for example about 5 nm to about 10 μm and a thickness of the second encapsulation thin film 40b may be, for example about 5 nm to about 10 μm.

A thickness of the encapsulation thin film 40 may be for example about 10 nm to about 20 μm.

Referring to FIG. 3, the encapsulation thin film 40 may further include a primer layer 45 in the structure of FIG. 2.

The primer layer 45 may be disposed under the first encapsulation thin film 40a and may be disposed between the laminate (P) and the first encapsulation thin film 40a. The primer layer 45 may protect the quantum dot diode 30 during processing, e.g., formation, of the encapsulation thin film 40 and may simultaneously improve a close contacting property between the quantum dot diode 30 and the first encapsulation thin film 40a, e.g., improve contact of the quantum dot diode 30 and the first encapsulation thin film 40a.

Figure 4:
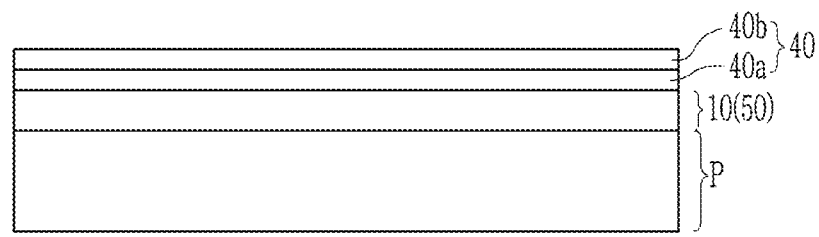
FIGS. 4 and 5 are schematic views of encapsulation thin films according to embodiments.
Figure 5:
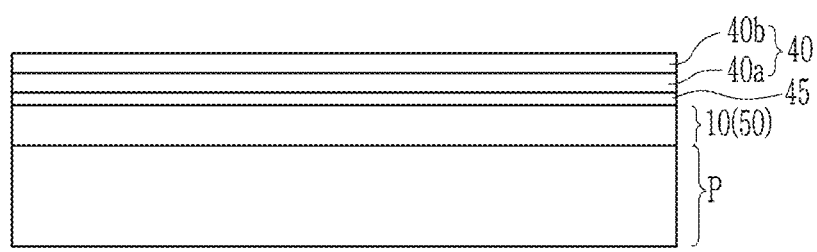

FIGS. 4 and 5 are schematic views of encapsulation thin films according to embodiments.

Referring to FIGS. 4 and 5, the encapsulation thin film 40 may be disposed on the laminate (P) of the active array layer 20 and the and the quantum dot diode 30 and may be disposed on the lower surface of the base substrate 10 or on the upper surface of the opposed substrate 50.

Referring to FIG. 4, the encapsulation thin film 40 may include, e.g., consist of, two layers and may include, e.g., consist of, a first encapsulation thin film 40a and a second encapsulation thin film 40b.

For example, the first encapsulation thin film 40a and the second encapsulation thin film 40b may be an inorganic thin film including an inorganic material or an organic thin film including an organic material. For example, the first encapsulation thin film 40a, the second encapsulation thin film 40b, or a combination thereof may be an inorganic thin film.

For example, the first encapsulation thin film 40a, the second encapsulation thin film 40b, or a combination thereof may be an organic thin film. For example, first encapsulation thin film 40a or the second encapsulation thin film 40b may be an inorganic thin film and the other of the first encapsulation thin film 40a and the second encapsulation thin film 40b may be an organic thin film. For example, the first encapsulation thin film 40a may be an inorganic thin film and the second encapsulation thin film 40b may be an organic thin film. For example, the first encapsulation thin film 40a may be an organic thin film and the second encapsulation thin film 40b may be an inorganic thin film.

The organic material may include a polymer and the polymer may be for example a curable resin, for example a photocurable resin, for example a thiol-based resin, an epoxy resin, or a combination thereof, but is not limited thereto. The inorganic material may be for example an oxide, a nitride, an oxynitride, or a combination thereof, for example a metal oxide, a metal nitride, a metal oxynitride, a semi-metal oxide, a semi-metal nitride, a semi-metal oxynitride, or a combination thereof, but is not limited thereto.

A thickness of the first encapsulation thin film 40a may be, for example about 5 nm to about 10 μm and a thickness of the second encapsulation thin film 40b may be, for example about 5 nm to about 10 μm.

A thickness of the encapsulation thin film 40 may be for example about 10 nm to about 20 μm.

Referring to FIG. 5, the encapsulation thin film 40 may further include a primer layer 45 in the structure of FIG. 4.

The primer layer 45 may be disposed under the first encapsulation thin film 40a and may be disposed between the base substrate 10 and the first encapsulation thin film 40a or the opposed substrate 50 and the first encapsulation thin film 40a. The primer layer 45 may improve close contacting properties between the base substrate 10 and the first encapsulation thin film 40a or between the opposed substrate 50 and the first encapsulation thin film 40a, e.g., may improve contact of the base substrate 10 and the first encapsulation thin film 40a or contact of the opposed substrate 50 and the first encapsulation thin film 40a.

The encapsulation thin film 40 disposed on the lower surface and the upper surface of the quantum dot diode 30 may be the same or different.

For example, the encapsulation thin film 40 on the upper surface of the quantum dot diode 30 and the encapsulation thin film 40 on the lower surface of the quantum dot diode 30 may be an organic thin film, an inorganic thin film, or a combination thereof, respectively.

For example, the encapsulation thin film 40 on the upper surface of the quantum dot diode 30 may independently be an organic thin film, an inorganic thin film, or a combination thereof and the encapsulation thin film 40 on the lower surface of the quantum dot diode 30 may be a glass substrate.

The quantum dot display device 100 may be a bendable quantum dot display device, a foldable quantum dot display device, a curved quantum dot display device, or a rollable quantum dot display device.

Hereinafter, the embodiments are illustrated in more detail with reference to examples. However, these examples are exemplary, and the present disclosure is not limited thereto.

Manufacture of Encapsulation Thin Film

Preparation Example 1

An encapsulation thin film is formed by applying silicon oxide on a 125 micrometers (μm)-thick polyethylene terephtalate (PET) substrate in a chemical vapor deposition (CVD) method to form a 0.1 μm-thick inorganic thin film, and bar-coating an ultraviolet (UV) curable resin coating solution thereon and irradiating ultraviolet (UV) thereto to form a 50 μm-thick organic thin film.

The UV curable resin coating solution is prepared by blending 30 grams (g) of a pentaerythritol tetrakis(3-mercaptopropionate) (THIOCURE® PETMA, Bruno Bock Chem), 50 g of 1,3,5-triallyl-1,3,5-triazine-2,4,6(1H,3H,5H)-trione (TAIC, Nippon Kasei chemical), and 0.5 g of photo-initiator (Irgacure TPO, BASF).

Comparative Preparation Example 1

An encapsulation thin film is formed by applying silicon oxide on a 125 μm-thick PET substrate in a chemical vapor deposition (CVD) method to form a 0.1 μm-thick inorganic thin film.

Comparative Preparation Example 2

An encapsulation thin film is formed by bar-coating the UV curable resin coating solution thereon and irradiating ultraviolet (UV) thereto to form a 50 μm-thick organic thin film.

Evaluation I

A water vapor transmission rate and an oxygen transmission rate of the encapsulation thin film of Preparation Example 1 and Comparative Preparation Examples 1 and 2 are evaluated.

The water vapor transmission rate (WVTR) is evaluated according to ASTM F-1249 at 37° C. under relative humidity of 100% by using an Aquatran equipment made by Mocon Inc., and the oxygen transmission rate (OTR) is evaluated at 23° C. under relative humidity of 0% by using an Oxtran equipment made by Mocon Inc.

The results are shown in Table 1.

TABLE 1

| | Water Vapor Transmission Rate (WVTR) (grams per square meter per day (g/m$^2$/day)) | Oxygen Transmission Rate (OTR) (g/m$^2$/day) |
|---|---|---|
| Preparation Example 1 | 0.84 | 0.26 |
| Comparative Preparation Example 1 | 3.4 | 16 |
| Comparative Preparation Example 2 | 1.96 | 0.39 |

Referring to Table 1, the encapsulation thin film of Preparation Example 1 exhibits improved water vapor transmission rate and oxygen transmission rate compared with the encapsulation thin film of Comparative Preparation Examples 1 and 2.

Synthesis Example: Synthesis of Quantum Dot (1) Synthesis of ZnTeSe Core

Selenium (Se) and tellurium (Te) are dispersed in trioctylphosphine (TOP) respectively to obtain a 2 molar (M) Se/TOP stock solution and a 0.1 M Te/TOP stock solution.

0.125 millimoles (mmol) of zinc acetate, 0.25 mmol of oleic acid, and 0.25 mmol of hexadecylamine are put along with 10 milliliters (mL) of trioctylamine in a reactor and then, heated at 120° C. under vacuum. After 1 hour, an atmosphere in the reactor is substituted with nitrogen.

After heating the reactor at 240° C., the Se/TOP stock solution and the Te/TOP stock solution are rapidly added thereto in a Te/Se molar ratio of 1:25. After increasing the temperature to 300° C. and then maintaining the reaction solution for 30 minutes, the reaction solution is rapidly cooled down to room temperature, acetone is added thereto, and a precipitate obtained by centrifuging the mixture is dispersed in toluene to obtain a toluene dispersion of a ZnTeSe core quantum dot.

(2) Synthesis of ZnTeSe Core/ZnSeS Shell Quantum Dot

Trioctylamine is put in a 10 mL flask. 0.6 mmol of zinc acetate and 1.2 mmol of oleic acid are added thereto and then, treated under vacuum at 120° C. for 10 minutes. Subsequently, after substituting inside atmosphere of the flask with nitrogen ($N_2$), the toluene dispersion of the ZnTeSe core obtained in Step (1) is rapidly injected therein and then, heated up to 340° C. and reacted, while Se/TOP stock solution and 1 molar (M) STOP stock solution prepared by dispersing sulfur in trioctylphosphine are added thereto in a Se/S molar ratio of 1.2:2.8. When the reaction is complete, the reactor is cooled down, and the prepared nanocrystals are centrifuged with ethanol and dispersed in toluene to obtain a toluene dispersion of ZnTeSe/ZnSeS core/shell quantum dots.

Manufacture of Display Device

Example 1

A 25 nanometer (nm)-thick hole injection layer is formed by surface-treating a PET substrate (a base substrate) deposited with indium tin oxide (ITO) for 15 minutes with UV-ozone, spin-coating a PEDOT:PSS solution (H. C. Starks), and then, heat-treating it under an air atmosphere at 150° C. for 10 minutes and then, under an $N_2$ atmosphere at 150° C. for 10 minutes again. Subsequently, on the hole injection layer, a 25 nm-thick hole transport layer is formed by spin-coating a poly[(9,9-dioctylfluorenyl-2,7-diyl-co(4,4'-(N-4-butylphenyl)diphenylamine] solution (TFB) (Sumitomo) and heat-treating it at 150° C. for 30 minutes. On the hole transport layer, a 25 nm-thick quantum dot layer is formed by spin-coating the toluene dispersion of ZnTeSe/ZnSeS core/shell quantum dots according to the Synthesis Example and heat-treating the same at 80° C. for 30 minutes. On the quantum dot layer, a second electrode is formed by vacuum-depositing aluminum (Al) to be 90 nm thick and resultantly, to form a quantum dot diode.

Subsequently, on the quantum dot diode, the encapsulation thin film of Preparation Example 1 is formed to face the organic thin film to the quantum dot diode, and then, a glass substrate and the PET substrate (an opposed substrate) are sealed to manufacture a quantum dot display device.

Comparative Example 1

A quantum dot display device is manufactured according to the same method as Example 1 except that the encapsulation thin film is not formed.

Comparative Example 2

A quantum dot display device is manufactured according to the same method as Example 1 except that the encapsulation thin film according to Comparative Preparation Example 1 is used instead of the encapsulation thin film of Preparation Example 1.

Comparative Example 3

A quantum dot display device is manufactured according to the same method as Example 1 except that the encapsulation thin film according to Comparative Preparation Example 2 is used instead of the encapsulation thin film of Preparation Example 1.

Reference Example 1

An organic light emitting diode (OLED) display is manufactured according to the same method as Example 1 except that an organic emission layer including an organic host material (ABH113, Sun Fine Chemicals, 97 wt %) and a blue dopant material (NUBD370, Sun Fine Chemicals, 3 wt %) and an electron transport layer including 2-(4-(9,10-di(naphthalen-2-yl)anthracen-2-yl)phenyl)-1-phenyl-1H-benzo[d]imidazole (CAS 561064-11-7) doped with Liq(8-Hydroxyquinolinolato-lithium) are formed instead of the quantum dot layer including a core/shell quantum dot.

Reference Example 2

A quantum dot display device is manufactured according to the same method as Example 1 except that a 0.7 mm-thick glass substrate is used instead of the encapsulation thin film.

Evaluation II

The quantum dot display device according to Example 1 and the Comparative Examples and the organic light emitting diode (OLED) display according to Reference Example 1 are stored at 60° C. under relative humidity of 95% for 8 days, and then, their light emitting surfaces are compared with the initial light emitting surfaces (the light emitting surfaces before the storage).

Figure 6A:
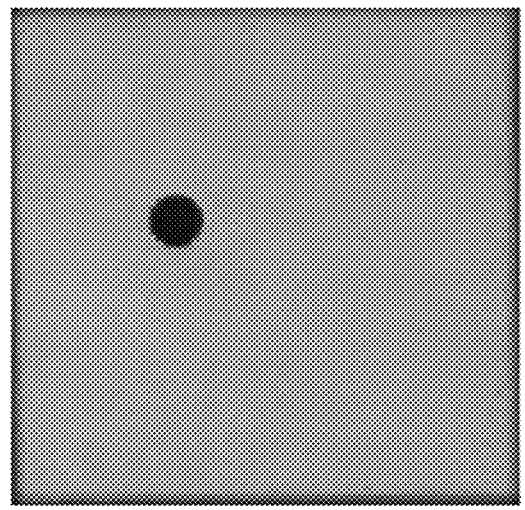
FIG. 6A is a photograph showing an initial light emitting surface of the quantum dot display device of Example 1.
Figure 6B:
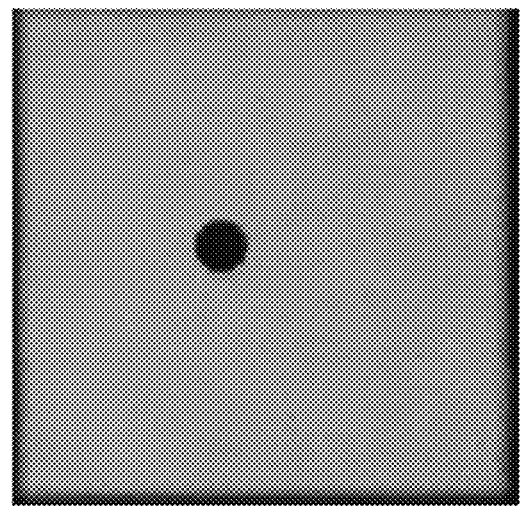
FIG. 6B is a photograph showing a light emitting surface of the quantum dot display device of Example 1 after storage at 60° C. under a relative humidity of 95% for 8 days.
Figure 7:
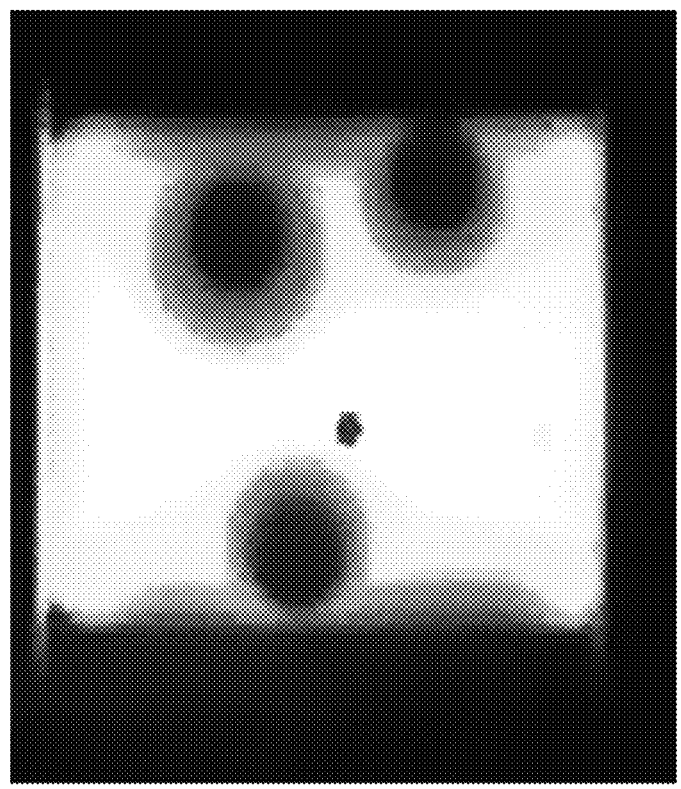
FIG. 7 is a photograph showing a light emitting surface of the quantum dot display device according to Comparative Example 1 after storage at 60° C. under a relative humidity of 95% for 8 days.
Figure 8:
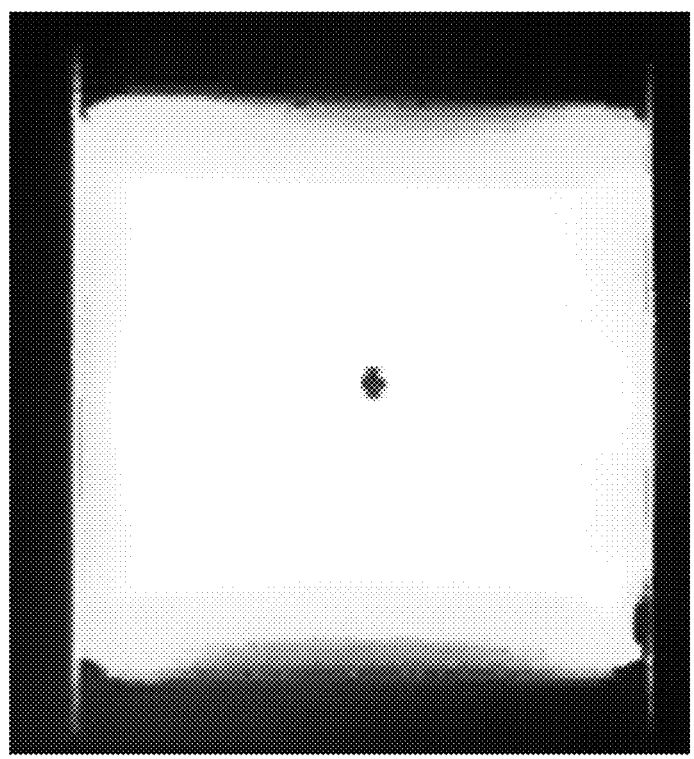
FIG. 8 is a photograph showing a light emitting surface of the quantum dot display device according to Comparative Example 2 after storage at 60° C. under a relative humidity of 95% for 8 days.
Figure 9:
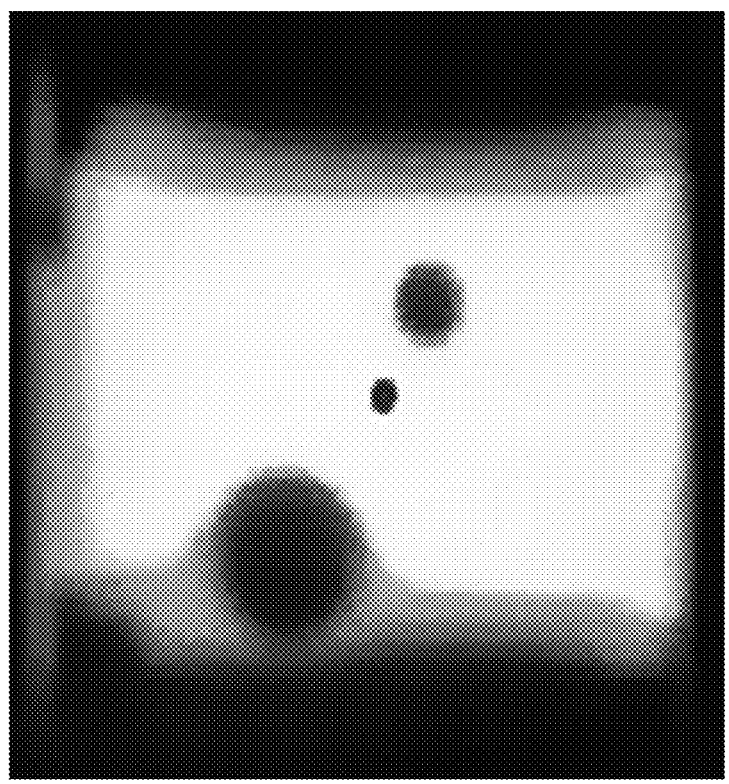
FIG. 9 is a photograph showing a light emitting surface of the quantum dot display device according to Comparative Example 3 after storage at 60° C. under a relative humidity of 95% for 8 days.
Figure 10A:
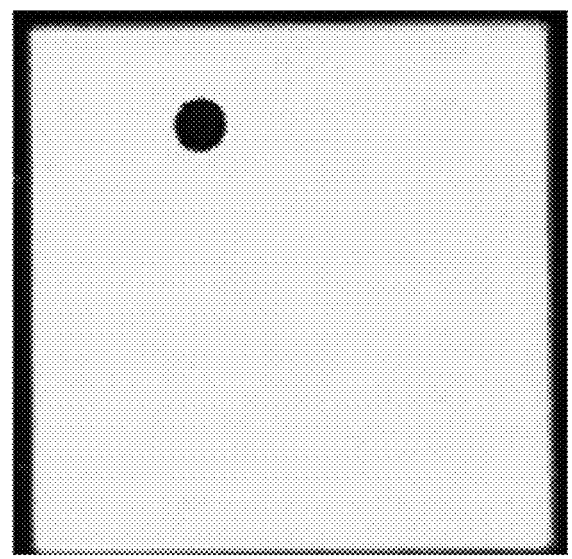
FIG. 10A is a photograph showing an initial light emitting surface of the organic light emitting diode (OLED) display according to Reference Example 1.
Figure 10B:
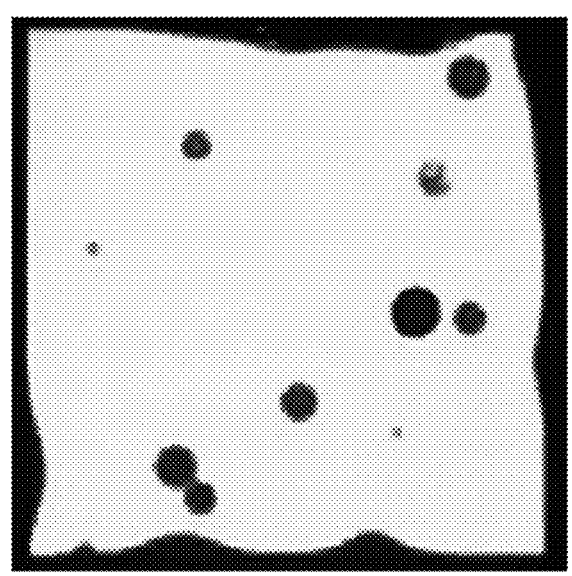
FIG. 10B is a photograph showing a light emitting surface of the organic light emitting diode (OLED) display according to Reference Example 1 after storage at 60° C. under a relative humidity of 95% for 8 days.

FIG. 6A is a photograph showing an initial light emitting surface of the quantum dot display device according to Example 1, FIG. 6B is a photograph showing a light emitting surface of the quantum dot display device according to Example 1 after storage at 60° C. under a relative humidity of 95% for 8 days, FIG. 7 is a photograph showing a light emitting surface of the quantum dot display device according to Comparative Example 1 after storage at 60° C. under a relative humidity of 95% for 8 days, FIG. 8 is a photograph showing a light emitting surface of the quantum dot display device according to Comparative Example 2 after storage at 60° C. under a relative humidity of 95% for 8 days, FIG. 9 is a photograph showing a light emitting surface of the quantum dot display device according to Comparative Example 3 after storage at 60° C. under a relative humidity of 95% for 8 days, FIG. 10A is a photograph showing an initial light emitting surface of the organic light emitting diode (OLED) display according to Reference Example 1, and FIG. 10B is a photograph showing a light emitting surface of the organic light emitting diode (OLED) display according to Reference Example 1 after storage at 60° C. under a relative humidity of 95% for 8 days.

Referring to FIGS. 6A and 6B, the quantum dot display device according to Example 1 exhibits almost no change on the light emitting surface after the storage for 8 days from the initial light emitting surface. On the contrary, referring to FIGS. 7 to 9, the quantum dot display device according to the Comparative Examples exhibit increased display stains, reduced light emitting area, or a combination thereof after the storage for 8 days. Further, referring to FIGS. 10A and 10B, the organic light emitting diode (OLED) display according to Reference Example 1 exhibits increased display stains after the storage for 8 days compared with the initial light emitting surface.

Accordingly, the quantum dot display device according to Example 1 may sufficiently prevent degradation of display quality by water vapor and oxygen due to the aforementioned encapsulation thin film, but the quantum dot display device according to the Comparative Examples and the organic light emitting diode (OLED) display according to Reference Example 1 fails in preventing degradation of display quality by water vapor and oxygen.

Evaluation III

Current-voltage-luminescence characteristics of the quantum dot display devices according to Example 1 and the Comparative Examples are evaluated.

The current-voltage-luminescence characteristics are evaluated by using a Keithley 220 current source meter and a Minolta CS200 spectroradiometer.

An effective light-emitting area is calculated by taking a pixel that emits more than 1 nit (candela per square meter ($cd/m^2$)) with a camera (Samsung web camera) and comparing the effective light-emitting area with an area of the pixel.

The results are shown in Table 2.

TABLE 2

|  | Example 1 | Comparative Example 1 | Comparative Example 2 | Comparative Example 3 |
|---|---|---|---|---|
| External Quantum Efficiency (EQE) maximum (%) | 6.1 | 4.4 | 4.4 | 5.4 |
| EQE @ 1,000 nits (%) | 6.0 | 4.4 | 4.4 | 5.3 |
| Luminance ($cd/m^2$) @ 5 milliamperes (mA) | 231 | 166 | 169 | 208 |
| Effective light-emitting area (%) | 100 | 56 | 80 | 64 |

Referring to Table 2, the quantum dot display device according to Example 1 exhibits improved electrical and luminance properties compared with the quantum dot display devices according to the Comparative Examples.

Evaluation IV

Life-span characteristics of the quantum dot display devices according to Example 1 and Reference Example 2 are evaluated.

The life-span characteristics may be evaluated from the luminance variation ratio as a time goes, and the luminance is measured by using a Keithley 220 current source and a Minolta CS200 spectroradiometer.

Figure 11:
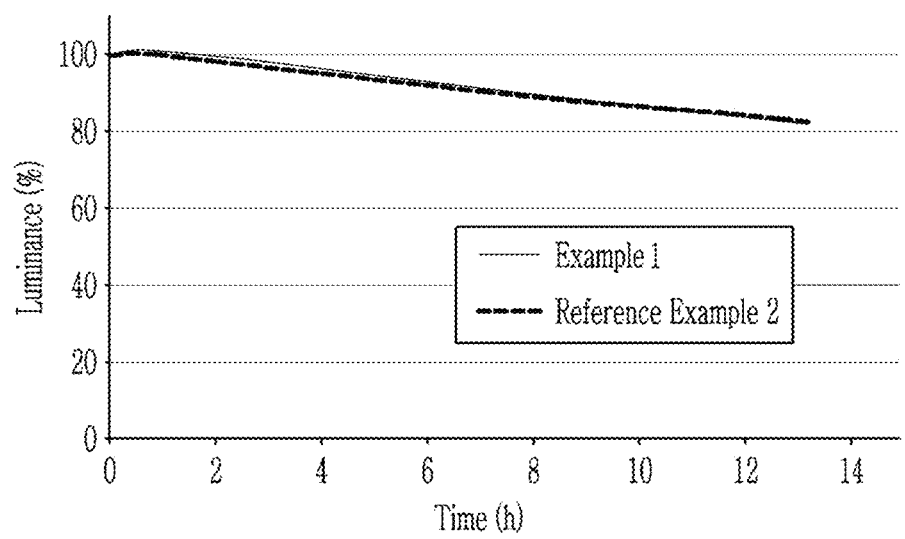
FIG. 11 is a graph of Luminance (percent (%)) versus Time (hours (h)) showing life-span characteristics of the quantum dot display devices of Example 1 and Reference Example 2.

The results are shown in FIG. 11.

FIG. 11 is a graph showing the life-span characteristics of the quantum dot display devices according to Example 1 and Reference Example 2.

Referring to FIG. 11, it is confirmed that the quantum dot display device according to Example 1 has almost no difference in life-span characteristics as compared with the quantum dot display device according to Reference Example 2.

From these results, it is confirmed that the encapsulation thin film used in the quantum dot display device according to Example 1 has advantages including thin thickness and desirable flexibility, without affect device performance.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A quantum dot display device, comprising
a substrate,
a quantum dot diode on the substrate, the quantum dot diode comprising a first electrode, a second electrode, and a quantum dot layer between the first electrode and the second electrode, and
an encapsulation film on a surface of the quantum dot diode,
wherein a water vapor transmission rate of the encapsulation film is about 0.84 to about 1 gram per square meter per day at 1 atmosphere of pressure, the water vapor transmission rate of the encapsulation film being the water vapor transmission rate when a decrease of effective light-emitting area of the quantum dot display device is less than or equal to about 10%.

2. The quantum dot display device of claim 1, wherein the encapsulation film is disposed on a first surface of the quantum dot diode and a second surface of the quantum dot diode, the second surface of the quantum dot diode being opposite the first surface of the quantum dot diode.

3. The quantum dot display device of claim 1, wherein the encapsulation film consists of two layers.

4. The quantum dot display device of claim 3, wherein the encapsulation film comprises an organic film.

5. The quantum dot display device of claim 4, wherein the organic film comprises a thiol resin, an epoxy resin, or a combination thereof.

6. The quantum dot display device of claim 3, wherein the encapsulation film comprises an inorganic film.

7. The quantum dot display device of claim 6, wherein the inorganic film comprises an oxide, a nitride, an oxynitride, or a combination thereof.

8. The quantum dot display device of claim 3, wherein the encapsulation film comprises an organic film and an inorganic film.

9. The quantum dot display device of claim 1, further comprising a primer layer on the encapsulation film, the primer layer being thinner than the encapsulation film.

10. The quantum dot display device of claim 1, wherein the encapsulation film is disposed between the substrate and the quantum dot diode.

11. The quantum dot display device of claim 1, wherein
a first surface of the substrate faces the quantum dot diode,
a second surface of the substrate is opposite the first surface of the substrate,
the second surface of the substrate does not face the quantum dot diode, and
the encapsulation film is disposed on the second surface of the substrate.

12. The quantum dot display device of claim 1, wherein the encapsulation film is disposed directly on the quantum dot diode.

13. The quantum dot display device of claim 1, further comprising a second substrate facing the substrate, the second substrate being disposed on a surface of the encapsulation film.

14. The quantum dot display device of claim 1, further comprising a sealant disposed between the quantum dot diode and the encapsulation film.

15. The quantum dot display device of claim 1, wherein an oxygen transmission rate of the encapsulation film is about 0.001 to about 1 cubic centimeter per square meter per day at 1 atmosphere of pressure.

16. The quantum dot display device of claim 1, wherein the quantum dot layer comprises a core-shell quantum dot, and
the core-shell quantum dot comprises
a core comprising
zinc and
tellurium, selenium, or a combination thereof, and
a shell disposed on at least one part of the core, the shell having a composition different from a composition of the core.

17. The quantum dot display device of claim 16, wherein the shell comprises ZnSeS, ZnS, or a combination thereof.

18. The quantum dot display device of claim 1, wherein the quantum dot layer comprises a core-shell quantum dot,
the core-shell quantum dot comprises
a core comprising
indium and
zinc, phosphorus, or a combination thereof, and
a shell disposed on at least one part of the core, the shell having a composition different from a composition the core.

19. The quantum dot display device of claim 18, wherein the shell comprises ZnSeS, ZnS, or a combination thereof.

20. The quantum dot display device of claim 1, wherein the quantum dot display device is bendable, foldable, curved, or rollable.

21. A quantum dot display device, comprising
a substrate,
a quantum dot diode on the substrate, the quantum dot diode comprising
a first electrode,
a second electrode, and
a quantum dot layer between the first electrode and the second electrode, the quantum dot layer comprising
a core-shell quantum dot comprising
a core comprising
zinc and
tellurium, selenium, or a combination thereof, and
a shell disposed on at least one part of the core, the shell having a composition different from a composition of the core, the shell comprising ZnSeS, ZnS, or a combination thereof, and
an encapsulation film on a surface of the quantum dot diode, wherein the encapsulation film
consists of two layers,
comprises an organic film comprising a thiol resin, an epoxy resin, or a combination thereof, and
comprises an inorganic film comprising an oxide, a nitride, an oxynitride, or a combination thereof,
wherein a water vapor transmission rate of the encapsulation film is about 0.84 to about 1 gram per square meter per day at 1 atmosphere of pressure, the water vapor transmission rate of the encapsulation film being the water vapor transmission rate when a decrease of effective light-emitting area of the quantum dot display device is less than or equal to about 10%.

* * * * *